(12) United States Patent
Kotake et al.

(10) Patent No.: US 9,166,182 B2
(45) Date of Patent: Oct. 20, 2015

(54) ORGANIC TRANSISTOR AND METHOD FOR PRODUCING THE SAME

(75) Inventors: Masayoshi Kotake, Chiba (JP); Masanori Kasai, Tokyo (JP); Hisatomo Yonehara, Sakura (JP); Kiyofumi Takano, Chiba (JP)

(73) Assignee: DIC Corporation, Tokyo (JP)

( * ) Notice: Subject to any disclaimer, the term of this patent is extended or adjusted under 35 U.S.C. 154(b) by 1173 days.

(21) Appl. No.: 13/055,303

(22) PCT Filed: Jun. 29, 2009

(86) PCT No.: PCT/JP2009/061837
§ 371 (c)(1),
(2), (4) Date: Jan. 21, 2011

(87) PCT Pub. No.: WO2010/010791
PCT Pub. Date: Jan. 28, 2010

(65) Prior Publication Data
US 2011/0121281 A1    May 26, 2011

(30) Foreign Application Priority Data
Jul. 22, 2008  (JP) ................................. 2008-188403

(51) Int. Cl.
*H01L 51/00* (2006.01)
*H01L 51/05* (2006.01)

(52) U.S. Cl.
CPC ........ *H01L 51/0558* (2013.01); *H01L 51/0003* (2013.01); *H01L 51/0566* (2013.01); *H01L 51/0007* (2013.01); *H01L 51/0545* (2013.01)

(58) Field of Classification Search
CPC ............ H01L 51/0003; H01L 51/0034; H01L 51/004; H01L 51/0076; H01L 51/0508; H01L 51/0545; H01L 51/0558
USPC ................ 257/40, E51.005, E51.006; 438/99
See application file for complete search history.

(56) References Cited

U.S. PATENT DOCUMENTS

| | | | |
|---|---|---|---|
| 6,875,996 B2 * | 4/2005 | Nakamura ...................... | 257/40 |
| 2003/0083396 A1 | 5/2003 | Ylitalo et al. | |
| 2004/0038459 A1 | 2/2004 | Brown et al. | |
| 2006/0159849 A1 | 7/2006 | Morita et al. | |
| 2006/0289859 A1 | 12/2006 | Yoneya | |
| 2007/0187674 A1 * | 8/2007 | Nakamura et al. ............. | 257/40 |
| 2007/0221916 A1 | 9/2007 | Shkunov et al. | |

FOREIGN PATENT DOCUMENTS

| | | |
|---|---|---|
| GB | 2432836 A | 6/2007 |
| JP | 2004-525501 A | 8/2004 |
| JP | 2007-005698 A | 1/2007 |
| JP | 2007-258724 A | 10/2007 |
| WO | WO-2004/027889 A1 | 4/2004 |

OTHER PUBLICATIONS

Supplemental European Search Report dated Jul. 10, 2013, issued for the European patent application No. 09800306.4.
Office Action mailed Feb. 13, 2014, issued for the European patent application No. 09800306 4.
Christos D. Dimitrakopoulos et al., "Organic Thin Film Transistors for Large Area Electronics," Adv. Mater. vol. 14, 2002, p. 99-117.
Janos Veres et al., "Gate Insulators in Organic Field-Effect Transistors," Chem. Mater., 2004, vol. 16, pp. 4543-4555.
Y.-Y, Lin et al., "Stacked Pentacene Layer Organic Thin-Film Transistors with Improved Characteristics," IEEE Electron Device Letters, vol. 18, 1997, pp. 606-608.
Ana Claudia Arias et al., "Surface-Induced Self-Encapsulation of Polymer Thin-Film Transistors," Adv. Mater. 2006, vol. 18, pp. 2900-2904.
International Search Report dated Aug. 4, 2009, issued for PCT/JP2009/061837.

* cited by examiner

*Primary Examiner* — Colleen A Matthews
*Assistant Examiner* — Colleen E Snow
(74) *Attorney, Agent, or Firm* — Locke Lord LLP; James E. Armstrong, IV; Nicholas J. DiCeglie, Jr.

(57) ABSTRACT

The object of the present invention is to provide an organic transistor using an organic semiconductor having excellent transistor properties, and a method for producing the organic transistor, the present invention providing, first, an organic transistor including a gate electrode (b), an insulating layer (c), an organic semiconductor layer (d) which contacts the insulating layer (c) and has a channel formation area, and source/drain electrodes (e), which are formed on (a) a substrate, wherein the organic semiconductor layer (d) contains a fluorine-based compound (surfactant), and, secondly, a method for producing an organic transistor comprising a gate electrode (b), an insulating layer (c), an organic semiconductor layer (d) which contacts the insulating layer (c) and has a channel formation area, and source/drain electrodes (e), which are formed on (a) a substrate, the method comprising: a step in which the organic semiconductor layer (d) is formed on the insulating layer (c) by printing or coating an organic semiconductor solution containing a fluorine-based surfactant; or a step in which the insulating layer (d) is formed on the organic semiconductor layer (d) containing a fluorine-based surfactant by printing or coating.

5 Claims, 1 Drawing Sheet

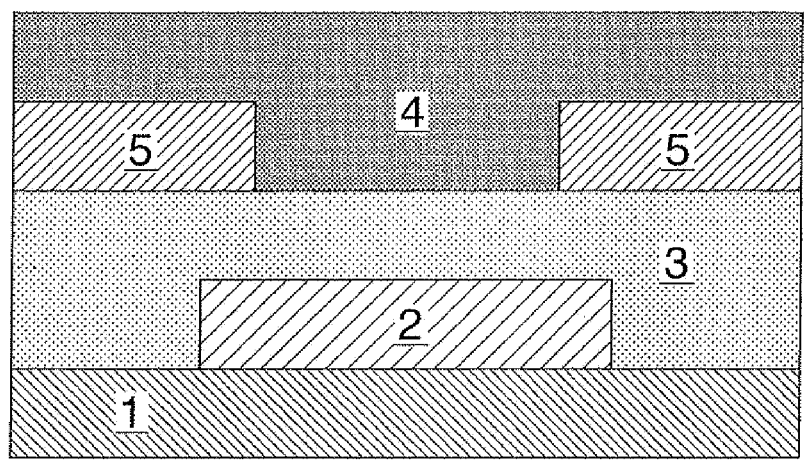

ORGANIC TRANSISTOR AND METHOD FOR PRODUCING THE SAME

TECHNICAL FIELD

The present invention relates to an organic transistor including an organic semiconductor, which is used in liquid crystal displays, electronic paper, EL display devices, RF-ID tags, etc., and a method for producing the organic transistor.

BACKGROUND ART

Transistors are widely used as an important electronic element (electronic part) constituting televisions or computers. At the present time, the transistors are produced using an inorganic material such as silicon. Recently, organic transistors having an organic element have received a great deal of attention (Non-Patent Document No. 1). The organic transistors can be formed by a wet-process such as a printing method. Therefore, a vacuum device, which is expensive and necessary to process silicon transistors, is not necessary. Due to this, production cost including facility investment can be dramatically reduced. In addition, processes can be carried out at low temperatures, and organic transistors can be formed on a plastic substrate. Therefore, organic transistors are thought to be an essential item in ubiquitous ages, that is, an essential component for achieving terminals having flexibility and low cost.

The organic transistor is an organic semiconductor element having essentially three electrodes, an insulating layer, and a semiconductor layer. As a production method for the electrode layer, the insulating layer, and the semiconductor layer, which form the organic semiconductor element, a wet-process such as a printing method and a dry-process such as a sputtering method can be exemplified. Among these, from the viewpoint of low-cost, a wet-process is preferable (Non-Patent Document No. 2).

In addition, as a method for improving the characteristics of the organic transistor, in order to improve crystallinity of the organic semiconductor layer making a channel formation area, a method has been suggested in which the surface of the gage insulating layer is treated with a surface treatment agent such as a silane coupling agent, and the channel formation area is formed thereon using organic semiconductor materials (Non-Patent Document No. 3 and Patent Document No. 1).

However, an ideal method for completely covering the surface of the substrate with a silane coupling agent without gaps inevitably increases liquid repellency of the surface of the insulating film. Due to this, it was difficult to form an organic semiconductor film having uniformity on the surface to be treated using an organic semiconductor solution. In the past, silane coupling agents used were limited, treatment conditions were limited, and the solvent used was also limited to carry out the surface treatment. In other words, when the conventional treatment methods are used, not only are the characteristics of the transistor produced limited, but also the solvent used is limited. Therefore, the wet-process is limited naturally. Due to this, it is difficult to produce a transistor having a large area and flexibility for practical use.

Examples of an organic semiconductor solution containing resin include a blend solution in which P3HT (poly(3-hexylthiophene)), PQT-12 (poly[5,5'-bis (3-dodecyl-2-thienyl)-2,2'-bithiophene]), or polymethyl methacrylate is dissolved in dichlorophenol. It is well-known that when the blend solution is spin-coated on the silicon oxide insulation film of which the surface is treated with a silane coupling agent, PMMA, which acts as a protective layer, is voluntarily separated as a layer, and forms a layer separation structure covering the organic semiconductor layer formed on the silicone oxide (Non-Patent Document No. 4). However, Non-Patent Document No. 4 does not disclose that a fluorine-based surfactant is added, and performance of the transistor can be improved.

PRIOR ART DOCUMENT

Patent Document

[Patent Document No. 1] Japanese Unexamined Patent Application, First Publication No. 2007-005698

Non-Patent Document

[Non-Patent Document No. 1] Advanced Materials, 2002, 14th, p. 99
[Non-Patent Document No. 2] Chemistry of Materials, 2004, 16th, p. 4543
[Non-Patent Document No. 3] IEEE Electron Device Letters vol. 12, p. 606 (1997)
[Non-Patent Document No. 4] Advanced Materials, vol. 18, p. 2900-2904 (2006)

DISCLOSURE OF THE INVENTION

Problems to be Solved by the Invention

To solve the above problems, the present invention provides an organic transistor including an organic semiconductor and having improved transistor properties, and a method for producing the organic transistor.

Means for Solving the Problem

First, the present invention provides an organic transistor including a gate electrode (b), an insulating layer (c), an organic semiconductor layer (d) which contacts the insulating layer (c) and has a channel formation area, and source/drain electrodes (e), which are formed on (a) a substrate, wherein the organic semiconductor layer (d) contains a fluorine-based compound (surfactant).

Second, the present invention provides a method for producing an organic transistor comprising a gate electrode (b), an insulating layer (c), an organic semiconductor layer (d) which contacts the insulating layer (c) and has a channel formation area, and source/drain electrodes (e), which are formed on (a) a substrate, the method comprising: a step in which the organic semiconductor layer (d) is formed on the insulating layer by printing or coating an organic semiconductor solution containing a fluorine-based surfactant; or a step in which the insulating layer is formed on the organic semiconductor layer (d) containing a fluorine-based surfactant by printing or coating.

Effects of the Present Invention

According to the present invention, transistor characteristics (electron field-effect mobility, ON/OFF ratio) can be improved by forming the organic semiconductor layer containing a fluorine-based compound (surfactant) in the organic transistor. In particular, when the organic semiconductor layer has crystallinity, the transistor characteristics can be further improved. The effects may be obtained by improving the alignment properties and crystallinity of the organic semiconductor molecules due to the addition of the fluorine-based surfactant. Of course, the present invention is not limited to this presumption.

In addition, according to the present invention, the organic semiconductor containing the fluorine-based surfactant is used. Therefore, the organic semiconductor is easily formed on the insulating film having an extremely high solution repellency on which the organic semiconductor film is hardly formed. In other words, an organic semiconductor thin film having high performance which exerts excellent transistor properties can be formed easily on an insulating film having an extremely high solution repellency which is treated so as to be a SAM (Self-Assembled Monolayer) with various silane coupling agents by a wet-process such as a printing method.

BRIEF DESCRIPTION OF THE FIGURES

FIG. 1 is a view showing schematically one example of the organic semiconductor element according to the present invention.

BEST MODE FOR CARRYING OUT THE INVENTION

The present invention relates to an organic transistor including a gate electrode (b), an insulating layer (c), an organic semiconductor layer (d) which contacts the insulating layer (c) and has a channel formation area, and source/drain electrodes (e), which are formed on a substrate (a). In particular, the organic transistor has a feature that the organic semiconductor layer contains a fluorine-based compound (surfactant).

The organic transistor according to the present invention can be produced by the following processes. That is, the production method includes: a step in which a gate electrode (b) is formed on a substrate (a), a step in which an insulating layer (c) is formed, and a step in which an organic semiconductor layer (d) contacting the insulation layer is formed. Regarding the relative positional relationship between the insulating layer (c) and the organic semiconductor layer (d) contacting the insulating layer, the organic semiconductor layer may be formed after formation of the insulating layer, or the insulating layer may be formed after formation of the organic semiconductor layer. It is preferable that these layers be formed by a printing method or a coating method.

The organic transistor according to the present invention may be a lateral transistor or a vertical transistor. Examples of the lateral transistor include bottom-gate (BG) transistors and top-gate (TG) transistors which are defined based on the position of the gate electrode relative to other transistors. In addition, the BG transistors and the TG transistors can be classified based on the relationship between the source/drain electrodes and the organic semiconductor layer into bottom-contact type transistors, top-contact type transistors, and bottom-top-contact type transistors.

According to the present invention, when the BG organic transistor is formed, the organic semiconductor layer containing the fluorine-based surfactant may be formed after formation of the insulating layer. On the other hand, when the TG organic transistor is formed, after formation of the organic semiconductor layer containing the fluorine-based surfactant, the insulating layer may be formed.

Any substrate can be used as the substrate in the organic transistor according to the present invention. Examples of the substrate include silicon substrates, thermally oxidized silicone film of which the surfaces are silicone-oxidized so as to be insulated, glass substrate, metal thin plate such as stainless steel, plastic films made of polycarbonate (PC), polyethylene terephthalate (PET), polyimide (PI), polyether sulfone (PES), or polyethylene naphthalate (PEN), and complex films including the plastic film and a hard coat layer having gas barrier properties. Among these, the plastic film can be preferably used, because the transistor including the plastic film is flexible.

Any method for forming layers can be used to form layers other than the organic semiconductor layer in the organic transistor according to the present invention. A dry-process and a wet-process can be used. For example, when the gate electrode (b) is formed, the dry-process, such as sputtering, evaporation deposition, ion-plating, photo lithography, and etching, and the wet-process, such as printing can be used. Among these, the wet-process is preferable, because it can dramatically reduce the manufacturing cost. Examples of the wet-process include an ink-jet method, screen printing method, spin coating method, bar coating method, slit coating method, dip coating method, spray coating method, gravure printing method, flexo printing method, gravure offset method, relief offset printing method, micro contacting printing method, and relief reverse printing method.

When the printing method is used to form the gate electrode (b), the conductive ink may include an appropriate solvent and a conductive component, for example, metal particles such as gold, silver, copper, nickel, zinc, aluminum, calcium, magnesium, iron, platinum, palladium, tin, chromium, lead, and alloys of those metals such as an alloy of silver and palladium; and thermally decomposed metal compounds which provide a conductive metal by decomposition at relatively low temperatures such as silver oxide, organic silver, and organic gold; and conductive metal oxide particles such as zinc oxide (ZnO), and indium tin oxide (ITO). In addition, a conductive polymer such as polyethylene dioxythiophene/polystyrene sulfonate (PEDOT/PSS), and polyaniline may be contained.

There is no limitation on the solvent used. Any solvent can be used as long as it can dissolve or disperse the conductive materials. For example, various organic solvents can be used, such as water, hydrocarbon-based organic solvents, alcohol-based organic solvents, ketone-based organic solvents, ether-based organic solvents, ester-based organic solvents, and fluorine-based organic solvents.

In addition, if necessary, a binder component such as resin, oxidation inhibitors, various catalysts for promoting a film formation, various adjusters for surface energy, leveling agents, mold release accelerators, may be added to the conductive ink for the gate electrode, in addition to the conductive material. A conductive ink, which is obtained by dispersing silver nanoparticles in the solvent, mixing a mold release agent such as low molecular silicone, and an adjuster for surface energy such as a fluorine-based surfactant, is preferable for a relief offset printing method. In addition, such a conductive ink has high patterning properties and high conductivity when it is sintered at low temperatures. Therefore, such a conductive ink is preferably used.

The conversion from an ink film layer to a functional layer in electronic parts can be carried out by an optimum method for ink properties or the electronic parts such as drying at normal temperatures, heating, irradiation with ultraviolet rays, or electron beam.

As explained above, any method for forming layers can be used to form layers other than the organic semiconductor layer in the organic transistor according to the present invention. A dry-process and a wet-process can be used. For example, in order to form the insulating layer (c), dry-processes such as sputtering, evaporation deposition, ion-plating, photo lithography, and etching, and the wet-processes, such as printing can be used. Among these, the wet-process is preferable, because it can reduce dramatically the manufacturing cost. Examples of the wet-process include an ink-jet method, screen printing method, spin coating method, bar coating method, slit coating method, dip coating method, spray coating method, gravure printing method, flexo printing method, gravure offset method, relief offset printing method, and relief reverse printing.

When the printing method is used to form the insulating layer (c), the insulating ink may include an insulating material such as epoxy resin, polyimide resin, polyvinyl pyrrolidone-based resin, polyvinyl alcohol-based resin, acrylonitrile-based resin, methacryl resin, polyamide resin, polyvinyl phenol-based resin, phenol resin, polyamide imide resin, fluorine resin, melamine resin, urethane resin, polyester resin, ad alkyd resin, These resins can be used alone or in combination thereof. In addition, the insulating ink may contain other components, for example, particles having a high specific inductive capacity such as alumina fine particles, silica fine particles, tantalum oxide fine particles; and particles having a low specific inductive capacity such as hollow silica fine particles.

There is no limitation on a solvent used in the insulating ink. Examples of the solvent include various organic solvents, such as water, hydrocarbon-based organic solvents, alcohol-based organic solvents, ketone-based organic solvents, ether-based organic solvents, ester-based organic solvents, glycol ether-based organic solvents, and fluorine-based organic solvents.

In addition, if necessary, the insulating ink can contain a binder component such as resin, oxidation inhibitors, leveling agents, mold release accelerators, and various catalysts for promoting film formation.

Furthermore, the insulating ink can also contain silicone-based surfactants or fluorine-based surfactants.

The conversion from an ink film layer to a functional layer in the transistor can be carried out by an optimum method for ink properties or the electronic parts such as drying at normal temperatures, heating, irradiation with ultraviolet ray, or electron beam.

As explained above, the gate electrode (b) and the insulating layer (c) may be formed by the dry-process or the wet-process. In contrast, the organic semiconductor layer (d) in the organic transistor according to the present invention has to be formed by the wet-process such as printing.

In order to form the organic semiconductor layer (d) in the organic transistor according to the present invention, organic semiconductors, which are dissolved in a solvent and used in the wet-process, can be used. Examples of the preferable organic semiconductor able to be dissolved in a solvent include polythiophenes such as P3HT (poly(3-hexylthiophene)), and PQT-12 (poly[5,5'-bis (3-dodecyl-2-thienyl 1)-2,2'-bithiophene]); thiophene-thienothiophene copolymers such as PB10TTT, PB12TTT, PB14TTT, and PB16PBTTT ("PBTTT" denotes poly (2,5-bis (3-alkylthiophene-2-yl) thieno[3,2-b]thiophene); soluble thiophene-based olygomers; fluorene-based polymers such as F8T2; phenylene vinylene-based polymers; triarylamine-based polymers, TIPS pentacenes, precursors of the organic semiconductors, and mixtures thereof. Among these, polythiophenes such as P3HT (poly(3-hexylthiophene), and PQT-12 (poly[5,5'-bis (3-dodecyl-2-thienyl 1)-2,2'-bithiophene]); thiophene-thienothiophene copolymers such as PB10TTT, PB12TTT, PB14TTT, and PB16PBTTT; and TIPS pentacenes are preferable. These organic semiconductors can be used alone or in combination. These organic semiconductors have high self-cohesive properties. When these organic semiconductors have a crystalline structure, they can exert high transistor performance.

Any solvent can be used in the organic semiconductor ink as long as it dissolves the organic semiconductor at normal temperature or when slightly heated, and has appropriate volatility, and forms the organic semiconductor layer after volatilization. Examples of the solvent include toluene, xylene, mesitylene, chloroform, anisole, methylene chloride, tetrahydrofuran, cyclohexanone, chlorobenzene-based solvents such as dichlorobenzene, and trichlorobenzene, and fluorine-based solvents. These solvents can be used alone or in combination.

The organic semiconductor ink for forming the organic semiconductor layer in the organic transistor according to the present invention has a feature including a fluorine-based surfactant. In particular, when the fluorine-based surfactant is added into the crystalline organic semiconductor ink, not only are the ink properties improved, but also the properties of the organic semiconductor formed by drying the ink, for example, the electric field effect mobility, etc. are improved.

In addition, it is also possible to secondarily add a small amount of a silicon-based surfactant or a hydrocarbon-based surfactant in order to improve the ink properties.

In this way, the present invention has the main feature of containing a fluorine-based surfactant in the organic semiconductor layer. In general, the surface of the gate insulating film in the organic transistors is SAM-treated (Self-Assembled Monolayer-treated) with a silane coupling agent such as hexamethyldisilazane (HMDS), octyltrichlorosilane (OTS-8), octadetyl trichlorosilane (OTS-18), dodecyl trichlorosilane (DTS), octatrichlorosilane substituted with fluorine (PFOTS), and β-phenethyl trichlorosilane, in order to improve the properties of the organic transistors.

However, the solution repellency of the finely SAM-treated surface is naturally large. It is difficult to form uniformly the organic semiconductor thin film on the surface. Therefore, there are significant limitations on the transistor structure used, solvent used, and printing method used. In the present invention, it is possible to form easily the uniform organic semiconductor layer on the gate insulating film having high solution repellency by adding the fluorine-based surfactant in the organic semiconductor ink, and thereby adjusting the surface energy of the organic semiconductor ink or the organic semiconductor film. Due to this fact, it is possible to freely select the optimum SAM treatment solution and conditions for forming the organic semiconductor. Thereby, it is possible to obtain transistor properties which have not previously been obtained.

As the fluorine-based surfactant, any surfactant can be used as long as it has a fluorine-containing group and a hydrophilic group and/or a hydrophobic group in a molecule. There is no limitation on the fluorine-containing group. However, the fluorine-containing group is preferably a perfluoroalkyl group in which all or a part of hydrogen of the alkyl group is substituted with a fluorine atom, or a perfluoropolyether group which is a perfluoroalkyl group bonded with an oxygen atom. When the fluorine-containing group is a perfluoroalkyl group, the number of carbon atoms is preferably 6 or more.

From the viewpoint of improvement of the transistor properties, such as electron field-effect mobility, and ON/OFF ratio, the fluorine-based surfactant is preferably a fluorinated (meth)acryl polymer. In fluorinated (meth)acryl polymer, the fluorine-containing group may be in a main chain, a side chain, or at the end of the polymer. However, from the viewpoint of control of the content of fluorine in the polymer, and ease of availability, the fluorine-containing group is preferably in a side chain. In addition, from the viewpoint of industrial simplicity, the polymer is preferably produced using fluorinated (meth)acrylate as a raw material. Below, methacrylate, acrylate, haloacrylate, and cyanoacrylate are collectively meant as (meth)acrylate unless otherwise noted. Moreover, the fluorinated (meth)acrylate is shown by the following formula (A-1):

$$CH_2=C(R_1)COO(X)_aC_mF_{2m+1} \quad (A-1)$$

(wherein $R_1$ denotes H, $CH_3$, Cl, F, or CN, X denotes a bivalent bonding group, specifically, $-(CH_2)_n-$, $-CH_2CH(OH)(CH_2)_n-$, $-(CH_2)_nN(R_2)SO_2-$, $-(CH_2)_nN(R_2)CO-$ (wherein n is an integer in a range of 1 to 10, $R_2$ denotes H or an alkyl group having 1 to 18 carbon atoms), $-CH(CH_3)-$, $-CH(CH_2CH_3)-$, $-C(CH_3)_2-$, $-CH(CF_3)-$, $-C(CF_3)_2-$, and $CH_2CFH-$, a denotes 0 or 1, and m denotes an integer of 1 to 20).

Example of the fluorinated (meth)acrylate include the following:

A-1: $CH_2=CHCOOCH_2CH_2C_8F_{17}$
A-2: $CH_2=C(CH_3)COOCH_2CH_2C_8F_{17}$
A-3: $CH_2=CHCOOCH_2CH_2C_{12}F_{25}$
A-4: $CH_2=CHCOOCH_2CH_2C_6F_{13}$
A-5: $CH_2=CHCOOCH_2CH_2C_4F_9$
A-6: $CH_2=CFCOOCH_2CH_2C_6F_{13}$
A-7: $CH_2=CHCOOCH_2CF_3$
A-8: $CH_2=C(CH_3)COOCH_2CF(CF_3)_2$
A-9: $CH_2=C(CH_3)COOCH_2CFHCF_3$
A-10: $CH_2=CHCOOCH_2(CF_2)_6H$
A-11: $CH_2=CHCOOCH_2CH(OH)CH_2C_8F_{17}$
A-12: $CH_2=CHCOOCH_2CH_2N(C_3H_7)SO_2C_8F_{17}$ and
A-13: $CH_2=CHCOOCH_2CH_2N(C_2H_5)COC_7F_{15}$.

Moreover, the present invention is not limited to these examples. The fluorinated (meth)acrylate can be used alone or in combination. It is preferable that the fluorinated (meth)acrylate polymer be a copolymer of the fluorinated (meth)acrylate and non-fluorinated (meth)acrylate, from the viewpoint of solubility into other components. There is no limitation on the non-fluorinated (meth)acrylate. However, from the viewpoint of solubility into other components, the non-fluorinated (meth)acrylate is preferably macro-monomer type non-fluorinated (meth)acrylate containing a polyoxyalkylene group.

Example of the macro-monomer type non-fluorinated (meth)acrylate containing a polyoxyalkylene group include NK Ester, M-20G, M-40G, M-90G, M-230G, M-450G, AM-90G, 1G, 2G, 3G, 4G, 9G, 14G, 23G, 9PG, A-200, A-400, A-600, APG-400, and APG-700, marketed by Shin-Nakamura Chemical Co., Ltd.; blend polymer, PE-90, PE-200, PE-350, PME-100, PME-200, PME-400, PME-4000, PP-1000, PP-500, PP-800, 70FEP-350B, 55PET-800, 50POEP-800B, 10PB-500B, 10APB-500B, NKH-5050, PDE-50, PDE-100, PDE-150, PDE-200, PDE-400, PDE-600, AP-400, AE-350, ADE-200, and ADE-400, marketed by NOF Corporation. Of course, the present invention is not limited to these macro-monomer type non-fluorinated (meth) acrylates.

Naturally, it is also possible to use a non-fluorinated (meth)acrylate other than those listed above. Examples of the non-fluorinated (meth)acrylate include vinyl ethers such as styrene, butadiene, nuclear-substituted styrene, acrylonitrile, vinyl chloride, vinylidene chloride, vinyl pyridine, N-vinyl pyrolidone, vinyl sulfonate, vinyl acetate, butyl vinyl ether, cyclohexyl vinyl ether, and hydroxyl butyl vinyl ether; α, β-ethylenically unsaturated carboxylic acids, for example, monovalent or divalent carboxylic acids such as acrylic acid, methacrylic acid, maleic acid, fumaric acid, and itaconic acid; α,β-ethylenically unsaturated carboxylic acid derivatives, for example, (meth)acrylic alkyl ester (below, this denotes both alkylester acrylate, and alkylester methacrylate) having an alkyl group containing 1 to 18 carbon atoms, such as methyl, ethyl, propyl, butyl, octyl, 2-ethyhexyl, decyl, dodecyl, and stearyl (meth)acrylate; hydroxyalkyl esters of (meth)acrylic acids such as 2-hydroxyethyl ester, hydroxypropyl ester, and hydroxybutyl ester; mono(acryloyloxyethyl)acid phosphate, mono(methacryloxyethyl)acid phosphate, benzyl (meth) acrylate, and phenoxyethyl(meth)acrylate. In addition, aminoalkyl esters of (meth)acrylic acids having 1 to 18 carbon atoms such as dimethyl aminoethyl ester, diethyl aminoethyl ester, and diethyl aminopropyl ester; ether-oxygen containing alkyl esters of (meth)acrylic acids having 3 to 18 carbon atoms such as methoxyethyl ester, ethoxyethyl ester, methoxypropyl ester, methylcarbyl ester, and butylcarbyl ester; cyclic monomers such as dicyclopentanyl oxyl ethyl (meth) acrylate, isobonyl oxyl ethyl (meth)acrylate, isobonyl (meth) acrylate, adamantyl (meth)acrylate, dimethyl adamantyl (meth)acrylate, dicyclopentanyl (meth)acrylate, and dicyclopentenyl (meth)acrylate; alkyl vinyl ethers having an alkyl group containing 1 to 18 carbon atoms such as methyl vinyl ether, propyl vinyl ether, and dodecyl vinyl ether; diglycidyl esters of (meth)acrylic acids such as glycidyl methacrylate, and glycidyl acrylate; and marketed products, for example, AA-6, and AN-6, marketed by Toagosei Co., Ltd.; silaplane FM-0711, FM-0721, and TM-0701T marketed by Chisso Corporation; HOA-MS, HOA-MPL, HOA-MPE, and HOA-HH marketed by Koeisha Chemical Col, Ltd.; and ARONIX® M-5300, M-5400, M-5500, M-5600, and M-5700 marketed by Toagosei Co., Ltd. can also be used. Moreover, the present invention is not limited to these examples.

These non-fluorinated (meth)acrylates can be used alone or in combination.

There is no limitation on the production method for the fluorinated (meth)acrylate. It is possible to use well-known methods, for example, solution polymerization methods, bulk polymerization methods, and emulsion polymerization methods based on polymerization methods such as radical polymerization methods, cation polymerization methods, and anion polymerization methods. Among these, the radical polymerization method is industrially preferable, because this method is simple.

When the fluorinated (meth)acrylate is produced, a well-known polymerization initiator, for example, peroxides such as benzoyl peroxide, and diacyl peroxide; azo compounds such as azobisisobutylonitrile, and phenyl azotriphenyl methane; and metal chelates such as $Mn(acac)_3$. The molecular weight of the polymer can be adjusted by the kind of polymerization method used or the polymerization initiator used. However, if necessary, a well-known chain transfer agent can be used. Examples of the chain transfer agent include lauryl mercaptan, 2-mercaptoethanol, ethylthioglycolic acid, and ocylthioglycolic acid.

In addition, it is possible to obtain the fluorinated random copolymers or block copolymers used in the present invention by photopolymerization in the presence of a photosensitizes or photoinitiator, or polymerization using radical rays or heat as an energy source. The polymerization can be carried out in the presence or absence of a solvent. However, the polymerization in the presence of a solvent is preferable from the viewpoint of workability. Examples of the solvent include ketones such as acetone, methyl ethyl ketone, and methyl isobutyl ketone; esters such as methyl acetate, ethyl acetate, and butyl acetate; polar solvents such as dimethyl formaldehyde, and dimethyl sulfoxide; halogen-based solvents such as 1,1,1-trichloroethane, and chloroform; ethers such as tetrahydrofuran, and dioxane; aromatic solvents such as benzene, toluene, and xylene; and fluorinated inert liquids such as perfluorooctane, and per-fluorotri-n-butyl amine.

The molecular weight of the fluorinated (meth)acrylate polymer is preferably in a range of 3,000 to 1,000,000, and more preferably in a range of 5,000 to 500,000, and most preferably in a range of 10,000 to 300,000.

The fluorinated surfactant added may be used alone or in combination of two or more. In addition, a small amount of a silicone-based surfactant or a hydrocarbon-based surfactant may be added, other than the fluorinated surfactant. Examples of the fluorinated surfactant include MEGAFACE® F-482, MEGAFACE® F-470 (R-08), MEGAFACE® F-472SF, MEGAFACE® R-30, MEGAFACE® F-484, MEGAFACE® 486, MEGAFACE® F-172D, MEGAFACE® MCF-350SF, and MEGAFACE® F-178RM, marketed by DIC Corporation. However, the present invention is not limited to these surfactants. In addition, these surfactants may be used alone or in combination.

The content of active components in the fluorinated surfactant in the ink composition is preferably in a range of 0.01% by mass to 5.0% by mass, and more preferably in a range of 0.05% by mass to 1.0% by mass.

In particular, the transistor properties such as electron field-effect mobility, and ON/OFF ratio are effectively improved by adding the fluorinated surfactant having high surface segregation properties in a polymer organic semiconductor having high crystallinity such as P3HT and PQT-12.

The organic semiconductor layer including the fluorinated surfactant can be easily produced by a wet-process. Examples of the wet-process include an ink-jet method, screen printing method, spin coating method, bar coating method, slit coating method, dip coating method, spray coating method, gravure printing method, flexo printing method, gravure offset printing method, relief offset printing method, micro contacting printing method, and relief reverse printing method.

There is no limitation on the production method for the source/drain electrodes (e) used in the organic transistor according to the present invention. The source/drain electrodes (e) can be produced by a dry-process or wet-process. Similar to the gate electrode (b), the source/drain electrodes (e) can be produced by the dry-process, such as sputtering, evaporation deposition, ion-plating, photo lithography, and etching, and the wet-process, such as printing can be used. Among these, the wet-process is preferable, because it can reduce dramatically the manufacturing cost. Examples of the wet-process include an ink jet method, screen printing method, spin coating method, bar coating method, slit coating method, dip coating method, spray coating method, gravure printing method, flexo printing method, gravure offset method, relief offset printing method, micro contacting printing method, and relief reverse printing method.

When the source/drain electrodes (e) are produced by the printing method, the conductive ink for the source/drain electrodes (e) may include an appropriate solvent and a conductive component, for example, metal particles such as gold, silver, copper, nickel, zinc, aluminum, calcium, magnesium, iron, platinum, palladium, tin, chromium, lead, and alloys of those metals such as an alloys of silver and palladium; and a thermally decomposed metal compound which provides a conductive metal by decomposition at relatively low temperatures such as silver oxide, organic silver, and organic gold; and conductive metal oxide particle such as zinc oxide (ZnO), and indium tin oxide (ITO), similar to the gate electrode (b). In addition, a conductive polymer such as polyethylene dioxy thiophene/polystyrene sulfonate (PEDOT/PSS), and polyaniline may be contained. There is no limitation on the solvent used. Any solvent can be used as long as it can dissolve or disperse the conductive materials. For example, various organic solvents can be used, such as water, hydrocarbon-based organic solvents, alcohol-based organic solvents, ketone-based organic solvents, ether-based organic solvents, and ester-based organic solvents.

In addition, if necessary, a binder component such as resin, oxidation inhibitors, various catalysts for promoting a film formation, various adjusters for surface energy, leveling agents, mold release accelerators, may be added to the conductive ink for the source/drain electrodes, in addition to the conductive material. A conductive ink, which is obtained by dispersing silver nanoparticles in the solvent, and mixing a mold release agent such as low molecular silicone, and an adjuster for surface energy such as a fluorine-based surfactant, is preferable for a relief offset printing method. In addition, such a conductive ink has high patterning properties and high conductivity when it is sintered at low temperatures. Therefore, such a conductive ink is preferably used.

The conversion from an ink film layer to a functional layer in electronic parts can be carried out by an optimum method for ink properties or the electronic parts such as drying at normal temperatures, heating, irradiation with ultraviolet rays, or electron beam.

EXAMPLES

Below, a test element having the bottom-gate and bottom-contact structure shown in FIG. 1 was produced, and properties of the organic transistor according to the present invention were evaluated. Specifically, the electron field-effect mobility, ON/OFF ratio were calculated based on Id-Vg value and Id-Vd value measured.

Synthetics Example 1

Production of Fluorinated (Meth)Acrylic Polymer
(1)

27 parts by weight of fluorinated (meth)acrylate (A-1), 21.6 parts by weight of polyoxypropylene monomethacyrlate (average polymerization degree: 5) as the non-fluorinated (meth)arylate, 5.4 parts by weight of 3-methcryloxypropyl tris(trimethylsiloxy) silane, 66.1 parts by weight of methyl ethyl ketone (MEK) as the polymer solvent, and 0.54 parts by weight of dimethyl 2,2'-azobis(2-methylpropionate) were put into a glass-flask having a stirrer, a condenser, a thermometer, and a dropping funnel.

In addition, a solution (as a dropping solution) containing 63 parts by weight of fluorinated (meth)acrylate (A-1), 50.4 parts by weight of polyoxypropylene monomethacyrlate (average polymerization degree: 5), 12.6 parts by weight of 3-methcryloxypropyl tris(trimethylsiloxy) silane, 124.2 parts by weight of MEK, and 1.26 parts by weight of dimethyl 2,2'-azobis(2-methylpropionate) was prepared separately.

While flowing nitrogen gas into the glass-flask, the mixture was heated to 80° C., and the produced dropping solution was dropped for 2 hours. Then, the solution was maintained at 80° C. for 3 hours. After that, a solution containing 0.9 parts by weight of dimethyl 2,2'-azobis(2-methylpropionate) dissolved in 9 parts by weight of MEK was further added to the solution. Then, the produced solution was held for 7 hours. Thereby, a fluorinated (meth)acrylic polymer (1) was produced. The weight average molecular weight (Mw) of the obtained polymer (1) in polystyrene conversion by the gel permeation chromatography (GPC) was 185,000.

Synthetics Example 2

Production of Fluorinated (Meth)Acrylic Polymer (2)

9.3 g of fluorinated (meth)acrylate (A-1), 18 g of 4-(6-acryloyloxyhexyloxy) phenyl benzene as the non-fluorinated (meth)acrylate, 220 mL of toluene as the polymerization solvent, and 0.05 g of 2,2'-azobis(2,4-dimethylvaleronitrile) as the polymerization initiator, were put into a glass-polymerization tube.

While flowing nitrogen gas into the glass-flask to remove oxygen, the mixture was reated to 60° C. for 24 hours. After the reaction was completed, the reaction solution was condensed. Then, the condensed reaction solution was dropped into 1 L of methanol. The participated solid was washed with methanol. Thereby, the fluorinated (meth)acrylic polymer (2) was produced. The weight average molecular weight (Mw) of the polymer (2) in polystyrene conversion by the gel permeation chromatography (GPC) was 47,000.

Example 1

A transistor element for tests having a bottom-gate bottom contact structure (BGBC structure) shown in FIG. 1 was produced by the following steps.
(1) Formation of a gate electrode: A Cr film was formed on an alkali-free glass by the sputtering method, and the obtained Cr film was etched to obtain a desired pattern. Thereby, the gate electrode was formed.
(2) Formation of a gate insulating layer: An insulating ink containing a copolymer of polyvinyl phenol and polymethacrylate as an insulating resin component was coated onto the Cr electrode by the spin coating method. Then, this was heated in a clean-oven at about 140° C. for about 1 hour. Thereby, the organic gate insulating layer having a thickness of about 1 μm was formed.
(3) Formation of a source/drain electrodes: A source and drain electrode pattern having a channel length of 50 μm and a channel width of 2 mm was formed on the gate insulating layer by the vacuum deposition method using a metal mask.
(4) Formation of an organic semiconductor layer: 1% by weight of the fluorinated surfactant (trade name: MEGAFACE® MCF-350SF, fluorinated (meth)acrylic polymer, weight average molecular weight (Mw): 53,000, marketed by DIC Corporation) was added into an organic semiconductor P3HT solution containing 0.5% by weight of xylene. The obtained solution was coated on the gate insulating layer by the spin coating method to form a P3HT thin film.
(5) The produced element was heated in a glove box at 150° C. for about 5 minutes. Then, the Id-Vg value and the Id-Vd value were measured by a semiconductor parameter measurement device (Model 4200; marketed by Keithley Instruments Inc.). Based on the Id-Vg value and the Id-Vd value measured, the electron field-effect mobility, ON/OFF ratio were calculated. Moreover, the unit of the electron field-effect mobility is $cm^2/Vs$. The results are shown in Table 1.

Example 2

The organic transistor element was produced in a manner identical to that of Example 1, except that the polymer obtained in the Synthetic Example 2 was used as the fluorinated surfactant to be added to the organic semiconductor (P3HT) solution instead of the fluorinated surfactant used in Example 1. The transistor properties measured are shown in Table 1.

Example 3

A transistor element for tests having a bottom-gate bottom contact structure (BGBC structure) shown in FIG. 1 was produced by the following steps.
(1) Formation of a gate electrode: A polycarbonate film including a hard coat layer having a thickness of 125 μm was cut to produce a film piece having a desired size. Then, a conductive ink, in which Ag nanoparticles were dispersed uniformly, was coated on the film by the spin coating method. Then, the film was heated at 180° C. for 30 minutes.
(2) Formation of a gate insulating layer: An insulating ink containing a copolymer of polyvinyl phenol and polymethacrylate as an insulating resin component was coated onto the Cr electrode by the spin coating method. Then, this was heated in a clean-oven at about 140° C. for about 1 hour. Thereby, the organic gate insulating layer having a thickness of about 0.8 μm was formed.
(3) Formation of a source/drain electrodes: A source and drain electrode pattern having a channel length of 50 μm and a channel width of 4 mm was formed on the gate insulating layer by the relief reverse printing using an insulating ink for reverse printing. Then, this was sintered at 180° C. for 30 minutes to form a Ag electrode.
(4) Formation of an organic semiconductor layer: An organic semiconductor ink was prepared by adding 1% by weight of a mixture containing the polymers (1) and (2) at 40% by weight/60% by weight, which were formed in the Synthetic Examples 1 and 2 as the fluorinated surfactant, in an organic semiconductor P3HT solution containing 0.5% by weight of xylene. The obtained solution was coated on a flat polydimethyl siloxane (PDMS) rubber to form a coated film using a bar coater. Then, an insulating layer including the source/drain electrodes, which was previously formed, was attached with force to the coated film. Thereby, the semiconductor coated film was transferred onto the insulating layer. Due to these processes, a P3HT semiconductor layer having a thickness of about 70 nm was formed on the insulating layer.
(5) The produced element was heated in a glove box at 150° C. for about 5 minutes. Then, the Id-Vg value and the Id-Vd value were measured by a semiconductor parameter measurement device (Model 4200; marketed by Keithley Instruments Inc.). Based on the Id-Vg value and the Id-Vd value measured, the electron field-effect mobility, ON/OFF ratio were calculated. Moreover, the unit of electron field-effect mobility is $cm^2/Vs$. The results are shown in Table 1.

Example 4

(1) Formation of a substrate, gate electrode, and insulating layer: A silicone wafer including a thermally oxidized silicone having a thickness of 300 nm was cut so as to have a desired size. Then, the surface made of the thermally oxidized silicone was modified with octyl trichlorosilane (OTS-8). The silicone surface, which is obtained by grinding using a diamond pen, was used as the gate electrode.
(2) Formation of an organic semiconductor layer: An insulating ink was produced by adding 3% by weight of the copolymer (1) produced in the Synthetic Example 1 as the fluorinated surfactant to an organic semiconductor P3HT solution containing 0.5% by weight of xylene. Then, the produced insulating ink was coated onto the surface, which was made of the thermally oxidized silicone substrate and treated with OTS-8, to produce the organic semiconductor layer having a thickness of about 70 run by the spin coating method.

(3) The produced element was heated in a glove box at 150° C. for about 5 minutes. Then, the Id-Vg value and the Id-Vd value were measured by a semiconductor parameter measurement device (Model 4200; marketed by Keithley Instruments Inc.). Based on the Id-Vg value and the Id-Vd value measured, the electron field-effect mobility, and ON/OFF ratio were calculated. The results are shown in Table 1.

Comparative Example 1

The comparative transistor element was produced in a manner identical to that of Example 1, except that the fluorinated surfactant was not added to the organic semiconductor ink. The properties examined are shown in Table 1.

Comparative Example 2

A comparative transistor element was attempted to be produced in a manner identical to that of Example 4, except that the fluorinated surfactant was not added to the organic semiconductor ink. However, the P3HT solution containing xylene which did not contain the fluorinated surfactant was shed on the surface, which was made of the oxide silicone, and treated with OTS-8, while spin coating. Consequently, the organic semiconductor coated film was not produced.

TABLE 1

|  | Example 1 | Example 2 | Example 3 | Example 4 | Comparative Example 1 | Comparative Example 2 |
| --- | --- | --- | --- | --- | --- | --- |
| Electron field-effect mobility | $9.6 \times 10^{-4}$ | $3.2 \times 10^{-3}$ | $2.3 \times 10^{-3}$ | $8.2 \times 10^{-3}$ | $4.2 \times 10^{-4}$ | — |
| ON/OFF ratio | $1.8 \times 10^{5}$ | $2.7 \times 10^{5}$ | $1.6 \times 10^{5}$ | $3.6 \times 10^{4}$ | $1.2 \times 10^{4}$ | — |

INDUSTRIAL APPLICABILITY

The organic semiconductor according to the present invention can be used in electronic elements which are used for liquid crystal displays, electronic paper, EL display devices, RF-ID tags, etc.

EXPLANATIONS OF SYMBOL

| 1: substrate | 2: gate electrode |
| --- | --- |
| 3: insulating film | 4: organic semiconductor |
| 5: source/drain electrodes | |

The invention claimed is:

1. An organic transistor including a gate electrode (b), a gate insulating film (c), and an organic semiconductor layer (d) which contacts the gate insulating film, is formed by printing or coating, and has a channel formation area, and source/drain electrodes (e), which are formed on (a) a substrate,
   wherein the organic semiconductor layer contains a fluorinated (meth) acrylic polymer, which is made using a fluorinated (meth)acrylate as a raw material; and
   the fluorinated (meth)acrylate is denoted by $$CH_2=C(R_1)COO(X)_aC_mF_{2m+1} \tag{A-1}$$

(wherein $R_1$ denotes H, $CH_3$, Cl, F, or CN, X denotes a bivalent bonding group, specifically, —$(CH_2)_n$—, —$CH_2CH(OH)(CH_2)_n$—, —$(CH_2)_nN(R_2)SO_2$—, —$(CH_2)_nN(R_2)CO$— (wherein n is an integer in a range of 1 to 10, $R_2$ denotes H or an alkyl group having 1 to 18 carbon atoms), —$CH(CH_3)$—, —$CH(CH_2CH_3)$—, —$C(CH_3)_2$—, —$CH(CF_3)$—, —$C(CF_3)_2$—, and $CH_2CFH$—, a denotes 0 or 1, and m denotes an integer of 1 to 20), wherein the organic semiconductor layer is made of an organic semiconductor material having crystallinity.

2. An organic transistor according to claim 1, wherein a surface of the gate insulating film contacting the organic semiconductor layer is subjected to a self-assembled monolayer treatment using a silane coupling agent.

3. An organic transistor including a gate electrode (b), a gate insulating film (c), and an organic semiconductor layer (d) which contacts the gate insulating film, is formed by printing or coating, and has a channel formation area, and source/drain electrodes (e), which are formed on (a) a substrate,
   wherein the organic semiconductor layer contains a fluorinated (meth) acrylic polymer, which is made using a fluorinated (meth)acrylate as a raw material; and
   the fluorinated (meth)acrylate is denoted by $$CH_2=C(R_1)COO(X)_aC_mF_{2m+1} \tag{A-1}$$

(wherein $R_1$ denotes H, $CH_3$, Cl, F, or CN, X denotes a bivalent bonding group, specifically, —$(CH_2)_n$—, —$CH_2CH(OH)(CH_2)_n$—, —$(CH_2)_nN(R_2)SO_2$—, —$(CH_2)_nN(R_2)CO$— (wherein n is an integer in a range of 1 to 10, $R_2$ denotes H or an alkyl group having 1 to 18 carbon atoms), —$CH(CH_3)$—, —$CH(CH_2CH_3)$—, —$C(CH_3)_2$—, —$CH(CF_3)$—, —$C(CF_3)_2$—, and $CH_2CFH$—, a denotes 0 or 1, and m denotes an integer of 1 to 20), wherein a surface of the gate insulating film contacting the organic semiconductor layer is subjected to a self-assembled monolayer treatment using a silane coupling agent.

4. A method for producing an organic transistor comprising a gate electrode (b), a gate insulating film (c), an organic semiconductor layer (d) which contacts the gate insulating film, and has a channel formation area, and source/drain electrodes (e), which are formed on (a) a substrate,
   the method comprising: a step in which the organic semiconductor layer is formed on the gate insulating film by printing or coating an organic semiconductor solution containing a a fluorinated (meth)acrylic polymer which is made using a fluorinated (meth)acrylate as a raw material; or a step in which the gate insulating film is formed on the organic semiconductor layer containing a fluorinated (meth)acrylic polymer which is made using a fluorinated (meth)acrylate as a raw material by printing or coating, and
   the fluorinated (meth)acrylate is denoted by $$CH_2=C(R_1)COO(X)_aC_mF_{2m+1} \tag{A-1}$$

(wherein $R_1$ denotes H, $CH_3$, Cl, F, or CN, X denotes a bivalent bonding group, specifically, —$(CH_2)_n$—, —$CH_2CH(OH)(CH_2)_n$—, —$(CH_2)_nN(R_2)SO_2$—, —$(CH_2)_nN(R_2)CO$— (wherein n is an integer in a range of 1 to 10, $R_2$ denotes H or an alkyl group having 1 to 18 carbon atoms), —$CH(CH_3)$—, —$CH(CH_2CH_3)$—, —$C(CH_3)_2$—, —$CH(CF_3)$—, —$C(CF_3)_2$—, and $CH_2CFH$—, a denotes 0 or 1, and m denotes an integer of 1 to 20), wherein the organic semiconductor layer is made of an organic semiconductor material having crystallinity.

5. A method for producing an organic transistor comprising a gate electrode (b), a gate insulating film (c), an organic semiconductor layer (d) which contacts the gate insulating film, and has a channel formation area, and source/drain electrodes (e), which are formed on (a) a substrate, the method comprising: a step in which the organic semiconductor layer is formed on the gate insulating film by printing or coating an organic semiconductor solution containing a a fluorinated (meth)acrylic polymer which is made using a fluorinated (meth)acrylate as a raw material; or a step in which the gate insulating film is formed on the organic semiconductor layer containing a fluorinated (meth)acrylic polymer which is made using a fluorinated (meth)acrylate as a raw material by printing or coating, and the fluorinated (meth)acrylate is denoted by $$CH_2=C(R_1)COO(X)_aC_mF_{2m+1} \tag{A-1}$$

(wherein $R_1$ denotes H, $CH_3$, Cl, F, or CN, X denotes a bivalent bonding group, specifically, —$(CH_2)_n$—, —$CH_2CH(OH)(CH_2)_n$—, —$(CH_2)_nN(R_2)SO_2$—, —$(CH_2)_nN(R_2)CO$— (wherein n is an integer in a range of 1 to 10, $R_2$ denotes H or an alkyl group having 1 to 18 carbon atoms), —$CH(CH_3)$—, —$CH(CH_2CH_3)$—, —$C(CH_3)_2$—, —$CH(CF_3)$—, —$C(CF_3)_2$—, and $CH_2CFH$—, a denotes 0 or 1, and m denotes an integer of 1 to 20), wherein a surface of the gate insulating film contacting the organic semiconductor layer is subjected to a self-assembled monolayer treatment using a silane coupling agent.

\* \* \* \* \*